United States Patent
Qin

(10) Patent No.: US 11,231,993 B2
(45) Date of Patent: Jan. 25, 2022

(54) SYMBOL-BASED VARIABLE NODE UPDATES FOR BINARY LDPC CODES

(71) Applicant: Western Digital Technologies, Inc., San Jose, CA (US)

(72) Inventor: Minghai Qin, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 124 days.

(21) Appl. No.: 16/205,099

(22) Filed: Nov. 29, 2018

(65) Prior Publication Data

US 2020/0174881 A1  Jun. 4, 2020

(51) Int. Cl.
| | |
|---|---|
| G06F 11/10 | (2006.01) |
| H03M 13/11 | (2006.01) |
| G11C 29/52 | (2006.01) |
| G11C 16/04 | (2006.01) |

(52) U.S. Cl.
CPC .......... *G06F 11/1068* (2013.01); *G11C 29/52* (2013.01); *H03M 13/1128* (2013.01); *G11C 16/0483* (2013.01)

(58) Field of Classification Search
CPC ............. G06F 11/1068; G06F 11/1012; G06F 11/108; H03M 13/1128; H03M 13/1111; G11C 29/52; G11C 16/0483; G11C 2029/0411; G11C 2029/52
See application file for complete search history.

(56) References Cited

U.S. PATENT DOCUMENTS

| | | | |
|---|---|---|---|
| 7,673,223 B2 | 3/2010 | Richardson | |
| 8,656,249 B2 | 2/2014 | Chen | |
| 8,924,812 B2 | 12/2014 | Li | |
| 9,244,763 B1 * | 1/2016 | Kankani | ............. G06F 11/1008 |
| 9,503,125 B2 | 11/2016 | Zhang | |

(Continued)

OTHER PUBLICATIONS

Luo et al., "Enabling Accurate and Practical Online Flash Channel Modeling for Modern MLC NAND Flash Memory", IEEE Journal on Selected Areas in Communications, vol. 34, No. 9, Sep. 2016, pp. 2294-2311. (Year: 2016).*

(Continued)

*Primary Examiner* — April Y Blair
*Assistant Examiner* — Rong Tang
(74) *Attorney, Agent, or Firm* — Vierra Magen Marcus LLP

(57) ABSTRACT

Systems and methods for implementing data protection techniques with symbol-based variable node updates for binary low-density parity-check (LDPC) codes are described. A semiconductor memory (e.g., a NAND flash memory) may read a set of data from a set of memory cells, determine a set of data state probabilities for the set of data based on sensed threshold voltages for the set of memory cells, generate a valid codeword for the set of data using an iterative LDPC decoding with symbol-based variable node updates and the set of data state probabilities, and store the valid codeword within the semiconductor memory or transfer the valid codeword from the semiconductor memory. The iterative LDPC decoding may utilize a message passing algorithm in which outgoing messages from a plurality of multi-variable nodes are generated using incoming messages (e.g., log-likelihood ratios or L-values) from a plurality of check nodes.

20 Claims, 14 Drawing Sheets

(56) References Cited

U.S. PATENT DOCUMENTS

| | | |
|---|---|---|
| 9,602,141 B2 | 3/2017 | Zhang |
| 9,748,973 B2 | 8/2017 | Zhang |
| 2018/0034477 A1* | 2/2018 | Zamir ................ H03M 13/1108 |
| 2020/0136653 A1* | 4/2020 | Kim ........................ G06F 11/10 |

OTHER PUBLICATIONS

Qin, "Symbol-Based Variable Node Updates for Binary LDPC Codes," U.S. Appl. No. 16/909,798, filed Jun. 23, 2020.

* cited by examiner

SYMBOL-BASED VARIABLE NODE UPDATES FOR BINARY LDPC CODES

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PCM). In recent years, both volatile and non-volatile memory devices have been scaled in order to reduce the cost per bit. However, as process geometries shrink, many design and process challenges are presented. These challenges include increased variability in memory cell I-V characteristics over process, voltage, and temperature variations and increased susceptibility to chip-level and system-level soft errors. Moreover, storing more than one data bit per memory cell (e.g., a multi-level or multi-state memory cell) may enhance data storage density at the expense of increased data errors.

DETAILED DESCRIPTION

Figure 1:
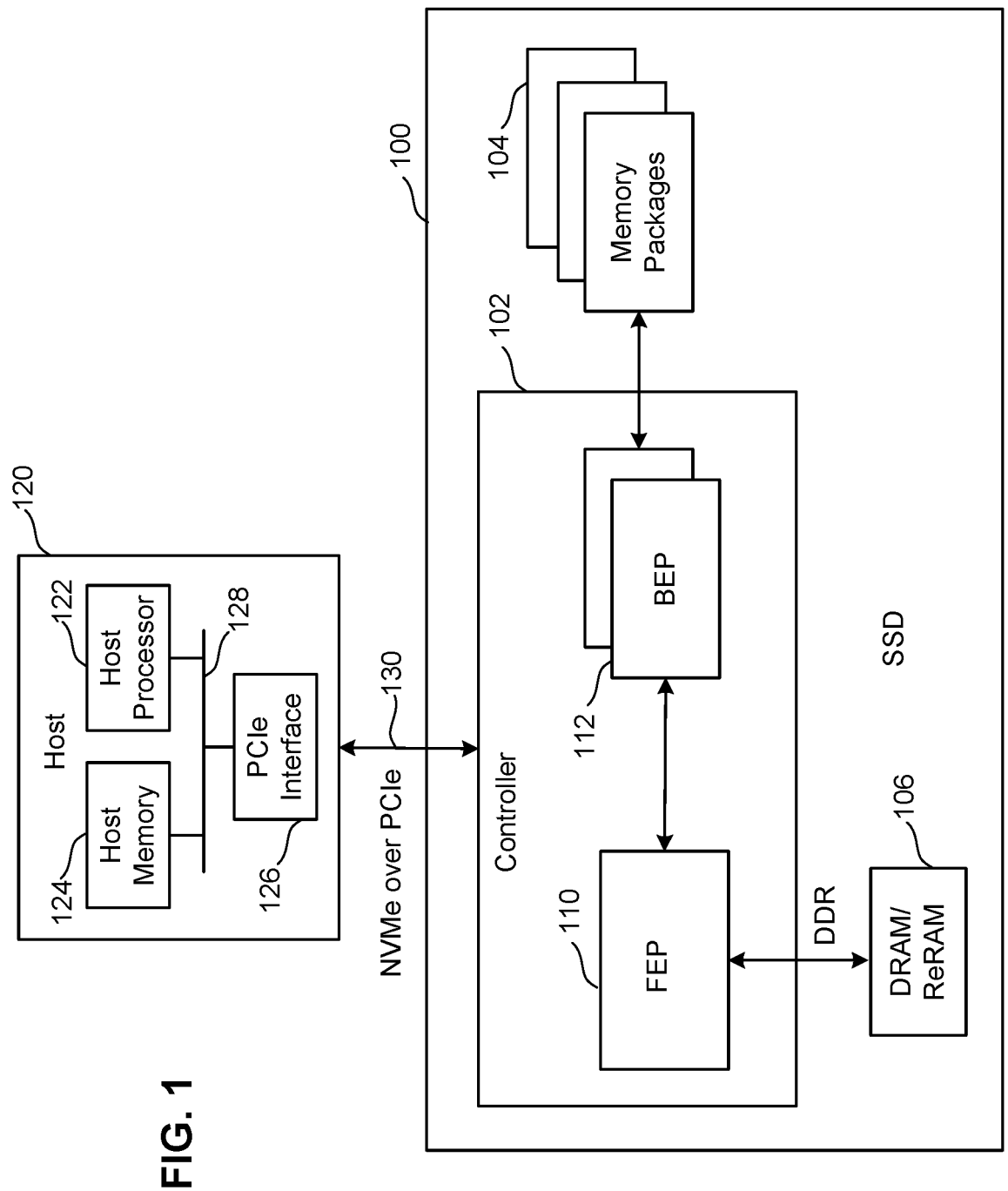
FIG. 1 is a block diagram of one embodiment of a memory system connected to a host.

Technology is described for implementing data protection techniques that protect data stored in semiconductor memory devices from data transmission and storage errors. The data errors may comprise random bit errors that are caused by alpha particles emitted from chip packaging materials or caused from various on-chip or off-chip noise sources, such as inductive or capacitive crosstalk from neighboring signal lines. In some cases, a semiconductor memory (e.g., a NAND flash memory or a phase change memory) may read a set of data from a set of memory cells, determine a set of data state probabilities for the set of data (e.g., based on the sensed threshold voltages for the set of memory cells), generate a valid codeword for the set of data using an iterative low-density parity-check (LDPC) decoding with symbol-based variable node updates and the set of data state probabilities, and then output (e.g., store or transfer) the valid codeword. In some cases, the probability that a memory cell stores a particular data state may be reduced (e.g., cut in half) if a sensed threshold voltage for the memory cell is close to the edge of a threshold voltage window (e.g., within 50 mV from the edges of the threshold voltage window for the B-state). The iterative LDPC decoding may utilize a message passing algorithm in which outgoing messages from a plurality of variable nodes (e.g., each comprising multi-variable nodes) are generated using incoming messages (e.g., log-likelihood ratios or L-values) from a plurality of check nodes. The set of data state probabilities may correspond with the probabilities of multi-level memory cell values (e.g., of two-bits per cell or three-bits per cell values). Multi-level cell memories may provide a non-binary channel as each memory cell may store more than two data states. One issue with non-binary LDPC codes is that although they maintain simplicity at the variable nodes, they are computationally heavy at the check nodes. One benefit of using symbol-based variable node updates for binary LDPC codes and adding computational complexity to the variable nodes by combining or grouping variable nodes into multi-variable nodes that take into account symbol likelihoods is that decoding performance may be increased.

Low-density parity-check (LDPC) codes are a class of linear block codes which may provide near-capacity performance with hardware implementable decoders. LDPC codes may comprise binary LDPC codes or non-binary LDPC codes that are capable of correcting symbol-based errors. A non-binary symbol may represent a grouping of two or more bits. LDPC codes may be represented using a Tanner graph (or a bipartite graph) in which variable nodes (VNs) correspond with the bits of a codeword (e.g., the data and parity bits that are stored within a non-volatile memory and/or transmitted from the non-volatile memory) and check nodes (CNs) correspond with a set of parity-check constraints that define the code. Each variable node may correspond with a code symbol of the codeword (e.g., each variable node may correspond with an individual bit out of a plurality of bits for the codeword) and each check node may correspond with one parity-check equation. The number of variable nodes may comprise the total number of input bits for the codeword. An edge of the Tanner graph connects a variable node to a check node and may correspond with a "1" in a parity-check matrix for the LDPC code. A check node is adjacent to and shares edges with all variable nodes whose corresponding codeword symbols appear in the parity check associated with the check node.

LDPC codes may be iteratively decoded using a message passing algorithm (e.g., iterative belief propagation decoding), in which messages are passed through the edges of the Tanner graph between check nodes and variable nodes. The message passing algorithm may comprise a sum-product decoding algorithm or max-product decoding algorithm. The variable nodes and check nodes may perform local decoding operations and exchange messages along the edges of the Tanner graph until either a valid codeword is identified or an iteration limit is reached (e.g., more than ten iterations have been performed). The messages may comprise soft values or likelihood information, such as the probability that a given bit in a codeword is a "1," a likelihood ratio of the probability that the given bit is a zero divided by the probability that the given bit is a one, or the logarithm of the likelihood ratio (e.g., the natural log of the likelihood ratio). The log-likelihood ratio may be referred to as an L-value. The L-value may correspond with the probability that a given bit or data state is a "0" or a "1." In one example, if the L-value is greater than 0, then the probability that the bit or data state is a "0" is greater than the probability that the bit or data state is a "1."

During a first iteration of a message passing algorithm, the incoming messages received from the channel at the variable nodes (e.g., the input codeword) are directly passed along their edges to their neighboring check nodes because there are no incoming messages from the check nodes during the first iteration. The check nodes then perform local decoding operations and compute outgoing messages that are functions of the incoming messages received from the neighboring variable nodes. Subsequently, these outgoing messages are sent back to the neighboring variable nodes. A complete iteration involves messages being passed back and forth between the variable nodes and the check nodes once. After each iteration, a determination may be made as to whether a valid codeword has been generated. If a valid codeword has been generated, then the codeword may be outputted and the iterative process may be terminated. The valid codeword comprising data and parity bits may be stored within a memory array of a semiconductor memory.

The semiconductor memory may comprise a non-volatile memory, such as a NAND Flash memory, or a volatile memory, such as a DRAM memory. The semiconductor memory may include a memory array that includes a plurality of NAND strings. In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

A non-volatile storage system may include a memory array in communication with a memory controller for controlling the operation of the memory array and/or for controlling the reading of data from the memory array and the writing of data to the memory array. The memory controller may comprise an on-chip controller or an off-chip controller. The one or more state machines, page registers, SRAM, and control circuitry within the memory controller for controlling the operation of the memory array may be referred to as managing or control circuits. The managing or control circuits may facilitate one or more memory array operations including forming, erasing, programming, or reading operations. In one example, the one or more managing or control circuits may include any one of or a combination of control circuitry, state machines, decoders, sense amplifiers, read/write circuits, and/or controllers. The managing or control circuits may also include error correcting circuits and decoder circuits, such as an LDPC decoding circuit, for detecting and correcting bit errors within data stored within the memory array. The managing or control circuits may cause data to be read from the memory array, detect a bit error within the data, and correct the bit error. The data to be written to the memory array may be buffered by the memory controller and error correcting code (ECC) data may be generated corresponding with the data to be written. The ECC data, which allows data errors that occur during transmission or storage to be detected and/or corrected, may be written to the memory array or stored in non-volatile memory within memory controller.

FIG. 1 is a block diagram of one embodiment of a memory system 100 connected to a host 120. Memory system 100 can implement the technology proposed herein. Many different types of memory systems can be used with the technology proposed herein. One example memory system is a solid state drive ("SSD"); however, other types of memory systems can also be used. Memory system 100 comprises a Controller 102, non-volatile memory 104 for storing data, and local memory (e.g. DRAM/ReRAM) 106. Controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
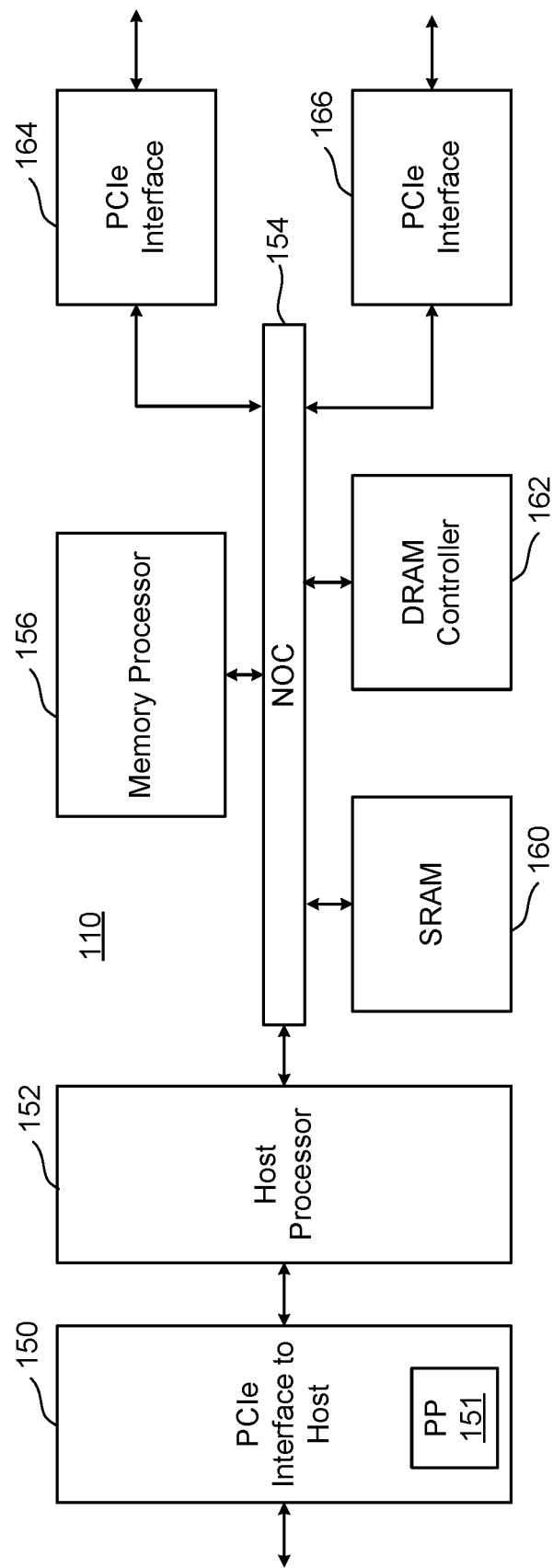
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in an SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 2, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 3:
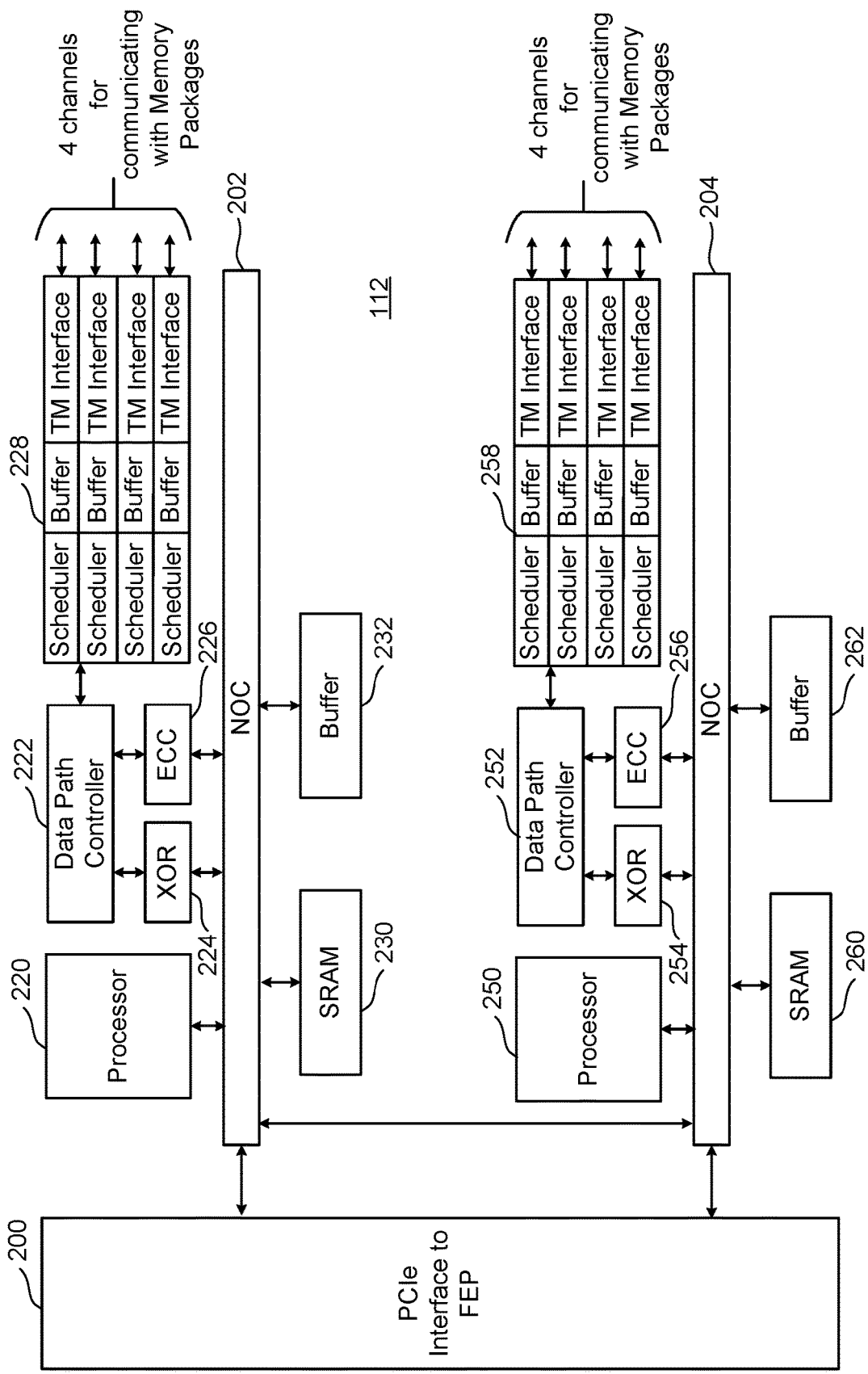
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to a memory interface 228 for communicating via four channels with memory packages. Thus, the top NOC 202 is associated with memory interface 228 for four channels for communicating with memory packages and the bottom NOC 204 is associated with memory interface 258 for four additional channels for communicating with memory packages. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits. In other embodiments, the memory interface (an electrical circuit for communicating with memory die) can be a different structure than depicted in FIG. 3. Additionally, controller with structures different than FIGS. 2 and 3 can also be used with the technology described herein.

Figure 4:
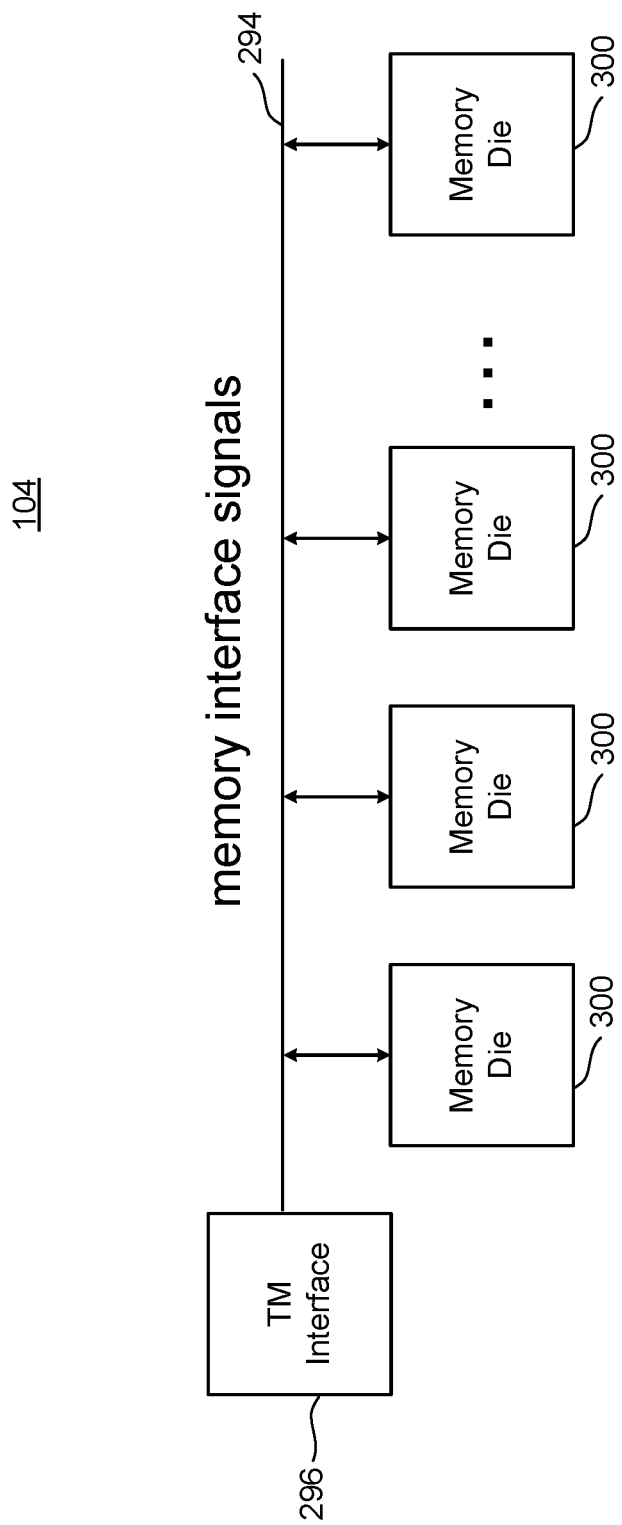
FIG. 4 is a block diagram of one embodiment of a memory package.

FIG. 4 is a block diagram of one embodiment of a memory package 104 that includes a plurality of memory die 300 connected to a set of memory interface signals 294. The memory interface signals 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes sixteen memory die; however, other numbers of memory die can also be implemented. The technology described herein is not limited to any particular number of memory die. FIG. 4 shows that some memory systems comprise a plurality of memory die 300 each having non-volatile memory cells that store data and may be connected to a control circuit (e.g., controller 102 or other control circuit, such as a microprocessor, state machine, FPGA, etc.). The controller (or other control circuit) is used to transfer data to the memory die, program the data in the memory die, read the date from the memory die and transfer the data read from the memory die.

Figure 5A:
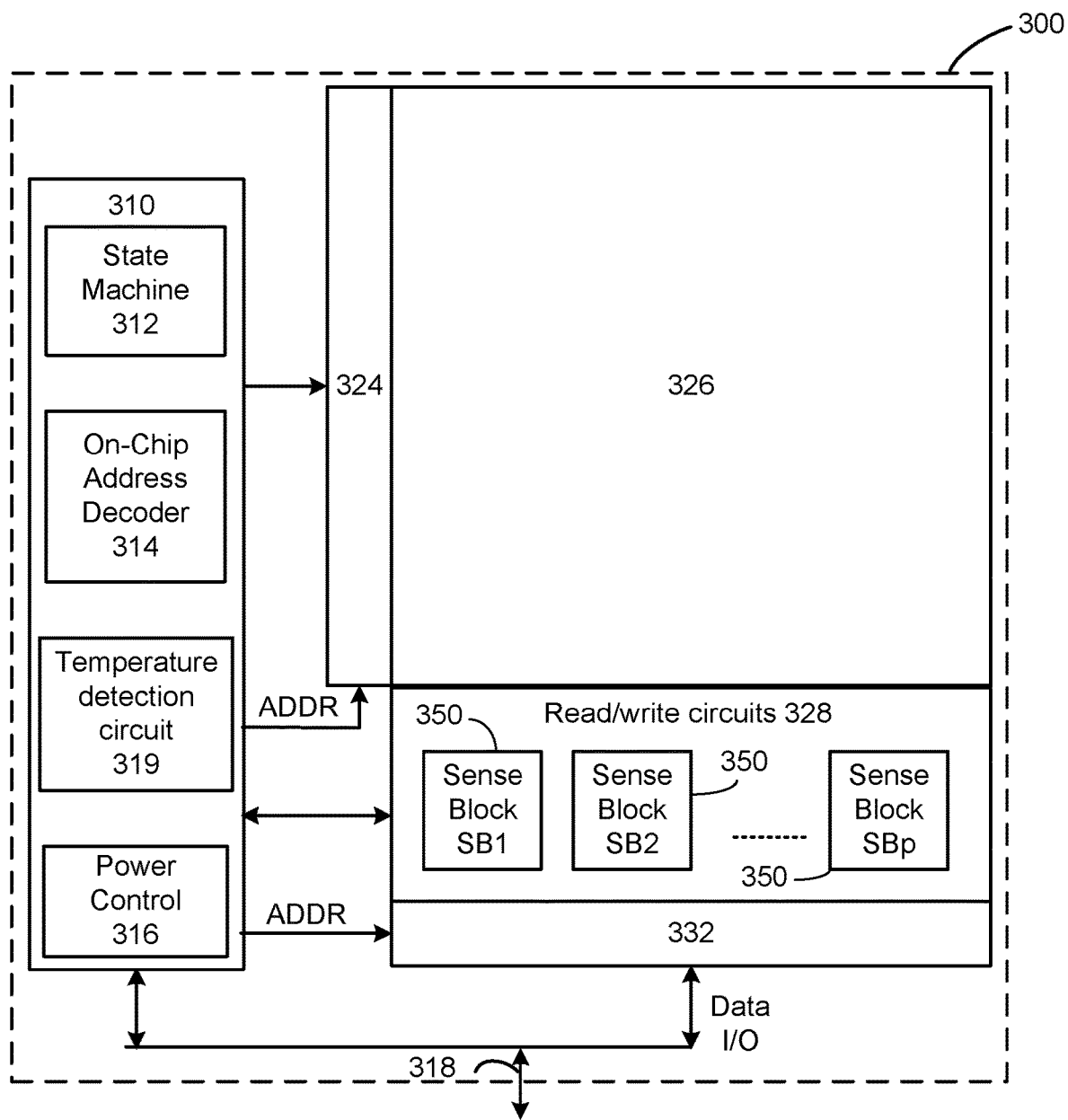
FIG. 5A is a block diagram of one embodiment of a memory die.

FIG. 5A is a functional block diagram of one embodiment of a memory die 300. Each of the one or more memory die of FIG. 4 can be implemented as memory die 300 of FIG. 5A. The components depicted in FIG. 5A are electrical circuits. In one embodiment, each memory die 300 includes a memory structure 326, control circuitry 310, row decoder 324, column decoder 332 and read/write circuits 328, all of which are electrical circuits. Memory structure 326 is addressable by word lines via row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block includes a sense amplifier and a set of latches connected to the bit line. The latches store data to be written and/or data that has been read. The sense blocks include bit line drivers.

Commands and data are transferred in and out of the memory die 300 via memory die interface 318, which connects to memory interface signals 294 of a memory package 104 (see FIG. 4).

Examples of memory die interface 318 include a Toggle Mode Interface and an Open NAND Flash Interface (ONFI). Other I/O interfaces can also be used. Toggle mode (e.g., Toggle Mode 2.0 JEDEC Standard or Toggle Mode 800) is an asynchronous memory interface that supports SDR and DDR with a DQS signal acting as a data strobe signal. Table 1 provides a definition of one example of a Toggle Mode Interface that can be used to implement memory die interface 318.

TABLE 1

| Signal Name | Type | Function |
| --- | --- | --- |
| ALE | Input | Address Latch Enable controls the activating path for addresses to the internal address registers. Addresses are latched on the rising edge of WEn with ALE high. |
| CEn | | Chip Enable controls memory die selection. |
| CLE | Input | Command Latch Enable controls the activating path for commands sent to the command register. When active high, commands are latched into the command register through the I/O ports on the rising edge of the WEn signal. |
| RE | Input | Read Enable Complement |
| REn | Input | Read Enable controls serial data out, and when active, drives the data onto the I/O bus. |
| WEn | Input | Write Enable controls writes to the I/O port. Commands and addresses are latched on the rising edge of the WEn pulse. |
| WPn | Input | Write Protect provides inadvertent program/erase protection during power transitions. The internal high voltage generator is reset when the WPn pin is active low. |
| DQS | Input/ Output | Data Strobe acts as an output when reading data, and as an input when writing data. DQS is edge-aligned with data read; it is center-aligned with data written. |
| DQSn | Input/ Output | Data Strobe complement (used for DDR) |
| Bus[0:7] | Input/ Output | Data Input/Output (I/O) signal bus inputs commands, addresses, and data, and outputs data during Read operations. The I/O pins float to High-z when the chip is deselected or when outputs are disabled. |
| R/Bn | Output | Ready/Busy indicates device operation status. R/Bn is an open-drain output and does not float to High-z when the chip is deselected or when outputs are disabled. When low, it indicates that a program, erase, or random read operation is in process; it goes high upon completion. |
| ZQ | Supply | Reference for ZQ calibration. |
| VCC | Supply | Power supply for memory die. |
| VCCQ | Supply | I/O power for I/O signals |
| VPP | Supply | Optional, high voltage, external power supply |
| VREF | Supply | Reference voltage, reserved fir Toggle Mode DDR2 |
| VSS | Supply | Ground |

In some example implementations, memory interface signals 294 of a memory package 104 (see FIG. 4) comprises the signals of Table 1; however, including multiple CEn signals (e.g., CEn0, CEn1, CEn2, . . . ). In one embodiment, memory interface signals 294 includes four CEn signals (e.g., CEn0, CEn1, CEn2, CEn3), the memory package 104 includes sixteen memory die 300, and each of the CEn signals is connected to four memory die 300 of the same package. In these embodiments, the same signal bus BUS[0:7] is connected to multiple memory die 300; therefore, the multiple CEn signals (e.g., CEn0, CEn1, CEn2, CEn3) and chip addresses (see below) are used to select a subset of memory die for a given operation.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature detection circuit 319. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise one or more control circuits for memory structure 326. These one or more control circuits are electrical circuits that perform the functions described below in the flow charts and signal diagrams. In other embodiments, the one or more control circuits can consist only of controller 102, which is an electrical circuit in combination with software, that performs the functions described below in the flow charts and signal diagrams. In another alternative, the one or more control circuits comprise controller 102 and control circuitry 310 performing the functions described below in the flow charts and signal diagrams. In another embodiment, the one or more control circuits comprise state machine 312 (or a microcontroller or microprocessor) alone or in combination with controller 102.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material. In another embodiment, memory structure 326 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 126 include two dimensional arrays, three dimensional arrays, cross-point arrays, stacked two dimensional arrays, vertical bit line arrays, and the like.

Figure 5B:
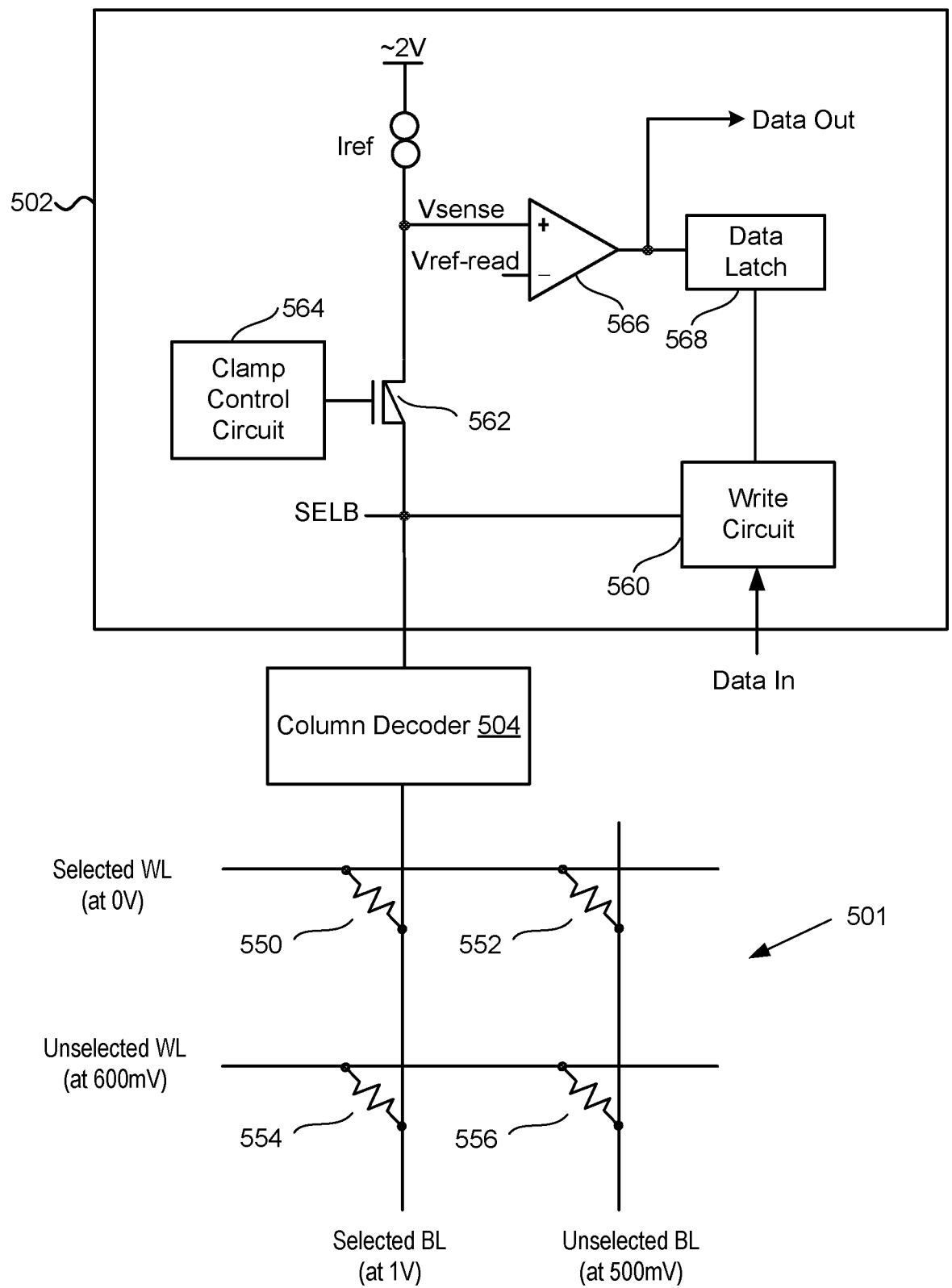
FIG. 5B depicts one embodiment of a read/write circuit.

FIG. 5B depicts one embodiment of a read/write circuit 502 along with a portion of a memory array 501. Read/write circuit 502 is one example of an implementation of read/write circuit 328 in FIG. 5A. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate. In another embodiment, the portion of a memory array 501 may comprise a memory array with bit lines arranged in a vertical direction that is perpendicular to the substrate.

As depicted, during a memory array operation (e.g., a read or sensing operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 1V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5B may be reversed such that the selected bit line is biased to 0V, the unselected word line is biased to 0.4V, the selected word line is biased to 1V, and the unselected bit line is biased to 0.5V.

As depicted in FIG. 5B, the SELB node of read/write circuit 502 may be electrically coupled to the selected bit line via column decoder 504. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns). In some cases, data read from a read/write circuit, such as read/write circuit 502 may contain a bit error.

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 6A:
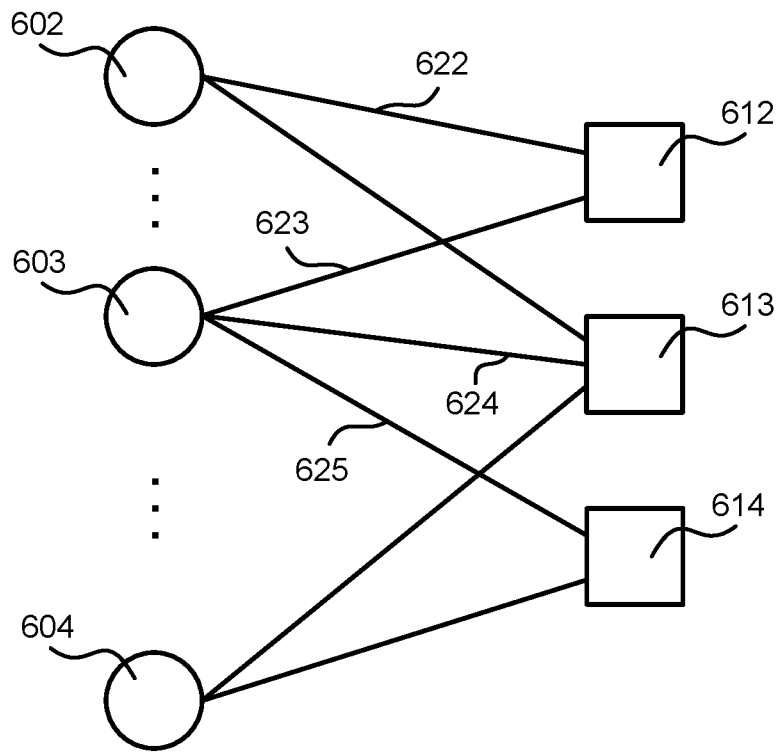
FIG. 6A depicts one embodiment of a Tanner graph.

FIG. 6A depicts one embodiment of a Tanner graph with variable nodes 602-604, check nodes 612-614, and edges including edges 622-625. As depicted, variable node 602 has edges to check nodes 612-613, variable node 603 has edges to check nodes 612-614, and variable node 604 has edges to check nodes 613-614. Although three variable nodes and three check nodes are depicted in FIG. 6A, other Tanner graphs may include additional variable nodes and check nodes. In these cases, the number of variable nodes, for example, may comprise 128 nodes or 256 nodes. In some cases, the check node 613 may correspond with one of the parity-check equations for the variable nodes 602-604. As there are no direct edges between the variable nodes, the local decoding operations may be performed independently and in parallel.

Figure 6B:
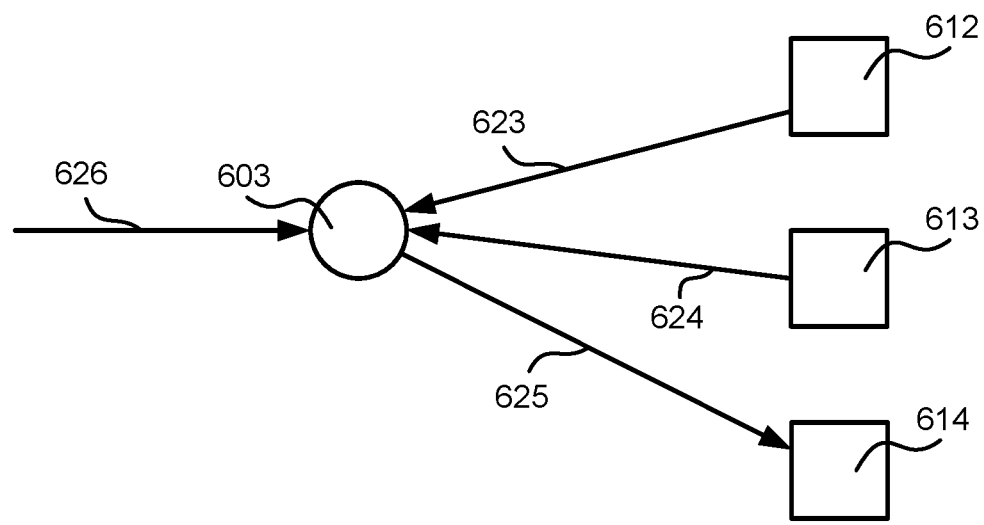
FIGS. 6B-6D depict embodiments of portions of a Tanner graph.

FIG. 6B depicts one embodiment of the variable node 603 in FIG. 6A with input channel message 626, input messages 623-624 from check nodes 612-613, and an output message 625 to check node 614. The channel message 626 may correspond with data read from a semiconductor memory or with a data probability for the data read from the semiconductor memory that that data comprise a particular data state. In the case that a three-bit per cell memory was read, the channel message 626 may comprise data identifying which data state out of the eight possible data states was sensed or eight input channel probabilities for each of the eight possible data states. As depicted, the output message 625 is generated using the input channel message 626 and input messages 623-624. The incoming message from check node 614 is not considered when updating or generating the output message 625 to the check node 614.

Figure 6C:
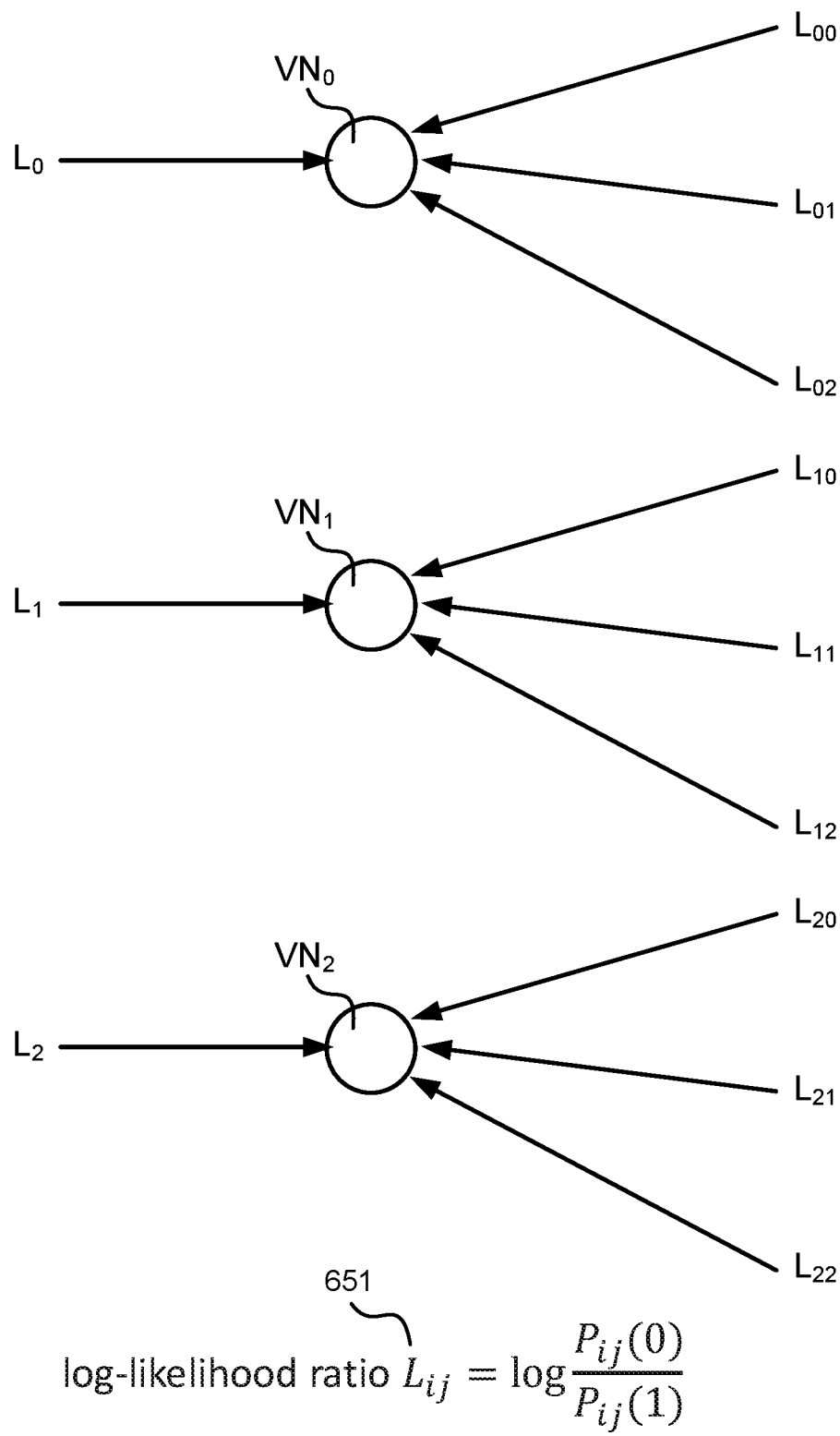

FIG. 6C depicts one embodiment of three variable nodes $VN_0$, $VN_1$, and $VN_2$ of a Tanner graph and incoming messages that may be processed and decoded by the variable nodes. Each of the three variable nodes may correspond with one bit or one symbol of an input codeword. The input codeword may have been read from a semiconductor memory or received from an off-chip data transfer to the semiconductor memory. The incoming messages may comprise log-likelihood ratios or L-values that were generated using a log-likelihood equation, such as equation 651 in which i is associated with a variable node and j is associated with a check node. The L-values associated with incoming messages $L_{00}$, $L_{01}$, and $L_{02}$ to variable node $VN_0$ may correspond with outgoing messages from three different check nodes not depicted. In one example, the L-value $L_{00}$ may correspond with a first edge from the variable node $VN_0$ to a first check node $CN_0$, the L-value $L_{01}$ may correspond with a second edge from the variable node $VN_0$ to a second check node $CN_1$, and the L-value $L_{02}$ may correspond with a third edge from the variable node $VN_0$ to a third check node $CN_2$. For the three variable nodes depicted, there are three incoming channel messages $L_0$, $L_1$, and $L_2$ corresponding with three different bit values or symbol values within the input codeword and nine incoming messages from check nodes within the Tanner graph.

Figure 6D:
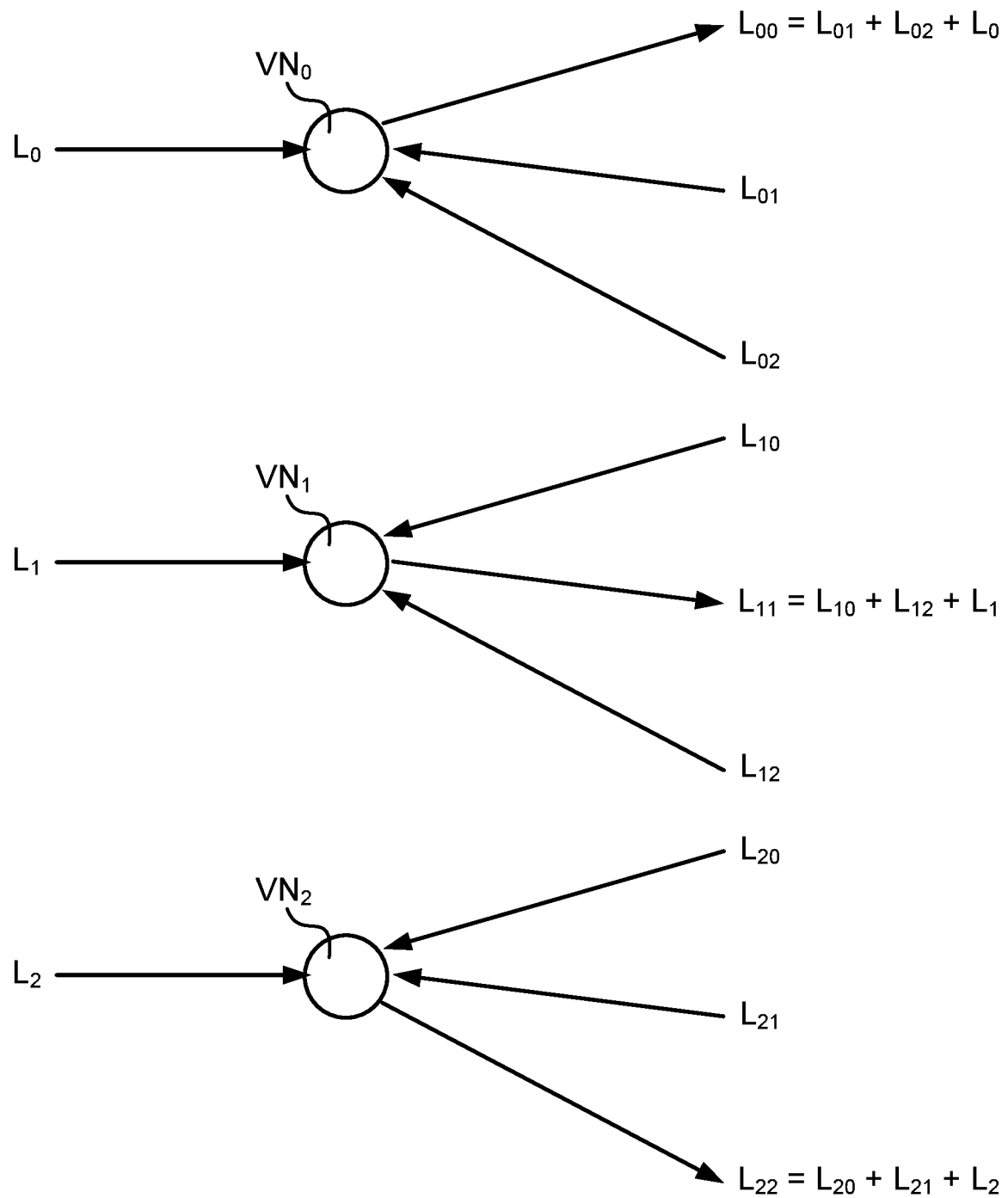

FIG. 6D depicts the three variable nodes of FIG. 6C in which output messages $L_{00}$, $L_{11}$, and $L_{22}$ have been generated and outputted. The output message $L_{00}$ may be generated as the sum of $L_{01}$, $L_{02}$, and $L_0$. The output message $L_{11}$ may be generated as the sum of $L_{10}$, $L_{12}$, and $L_1$. The output message $L_{22}$ may be generated as the sum of $L_{20}$, $L_{21}$, and $L_2$. When generating a particular output message at a variable node, the incoming message for the corresponding edge may not be taken into consideration.

Figure 6E:
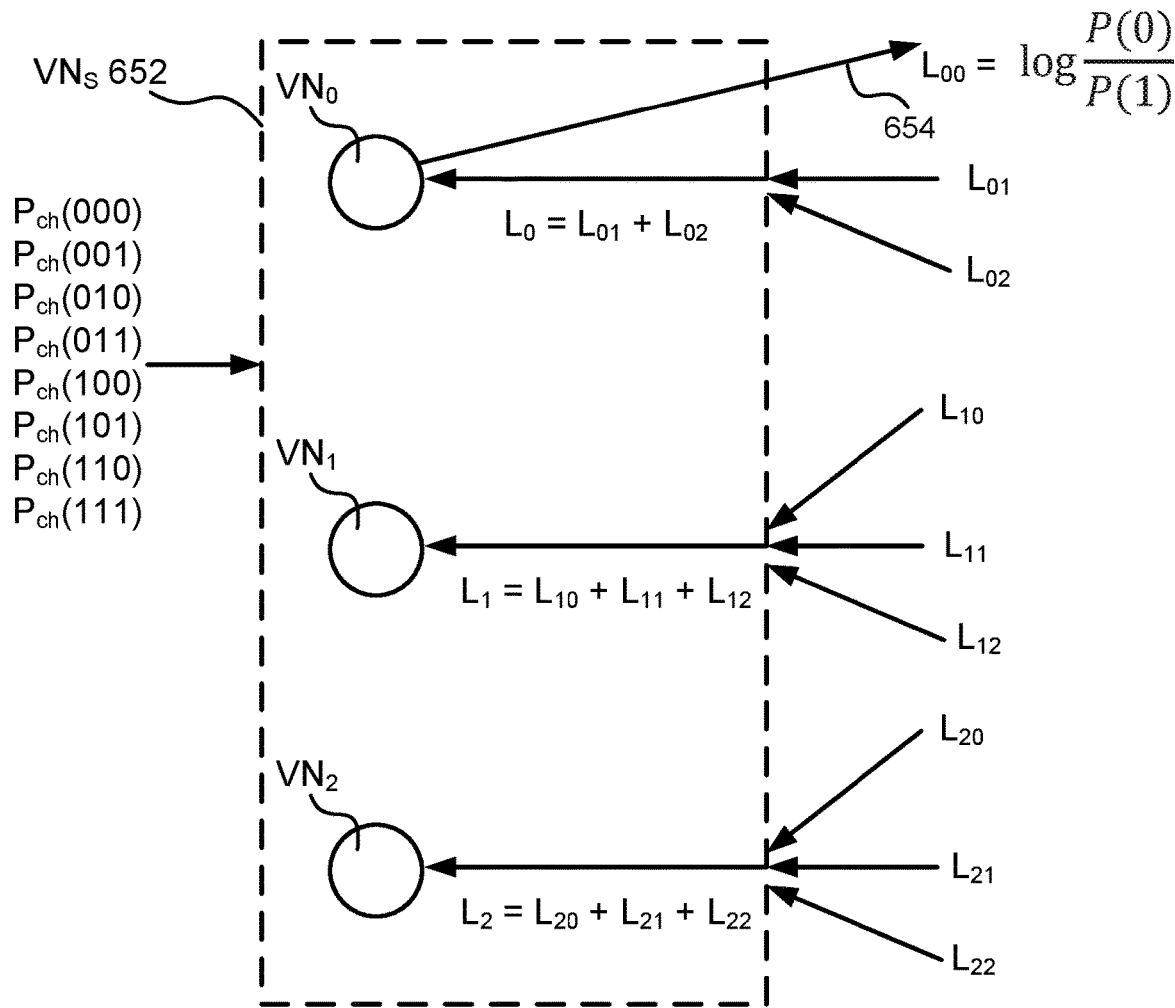
FIGS. 6E-6G depicts embodiments of a multi-variable node that is associated with multiple variable nodes.

FIG. 6E depicts one embodiment of a multi-variable node $VN_S$ 652 that is associated with multiple variable nodes $VN_0$, $VN_1$, and $VN_2$. The multi-variable node $VN_S$ 652 may correspond with the grouping of or the consolidation of variable nodes $VN_0$, $VN_1$, and $VN_2$. As depicted, the multi-variable node $VN_S$ 652 takes as input the eight input channel probabilities Pch(000) through Pch(111) for the eight data states corresponding with three data bits. The generated L-value $L_{00}$ 654 is equal to the log of P(0) 655 divided by P(1) 656. P(0) 655 is proportional to or equal to the sum of Pch(000)$e^{L0+L1+L2}$, Pch(001)$e^{L0+L1}$, Pch(010)$e^{L0+L2}$, and Pch(011)$e^{L0}$. P(1) 656 is proportional to or equal to the sum of Pch(100)$e^{L1+L2}$, Pch(101)$e^{L1}$, Pch(110)$e^{L2}$, and Pch(111). In this case, $L_0$ is equal to the sum of $L_{01}$ and $L_{02}$; $L_1$ is equal to the sum of $L_{10}$, $L_{11}$, and $L_{12}$; and $L_2$ is equal to the sum of $L_{20}$, $L_{21}$, and $L_{22}$. Thus, the output message for the generated L-value $L_{00}$ 654 takes into account all eight of the input channel probabilities Pch(000) through Pch(111).

Figure 6F:
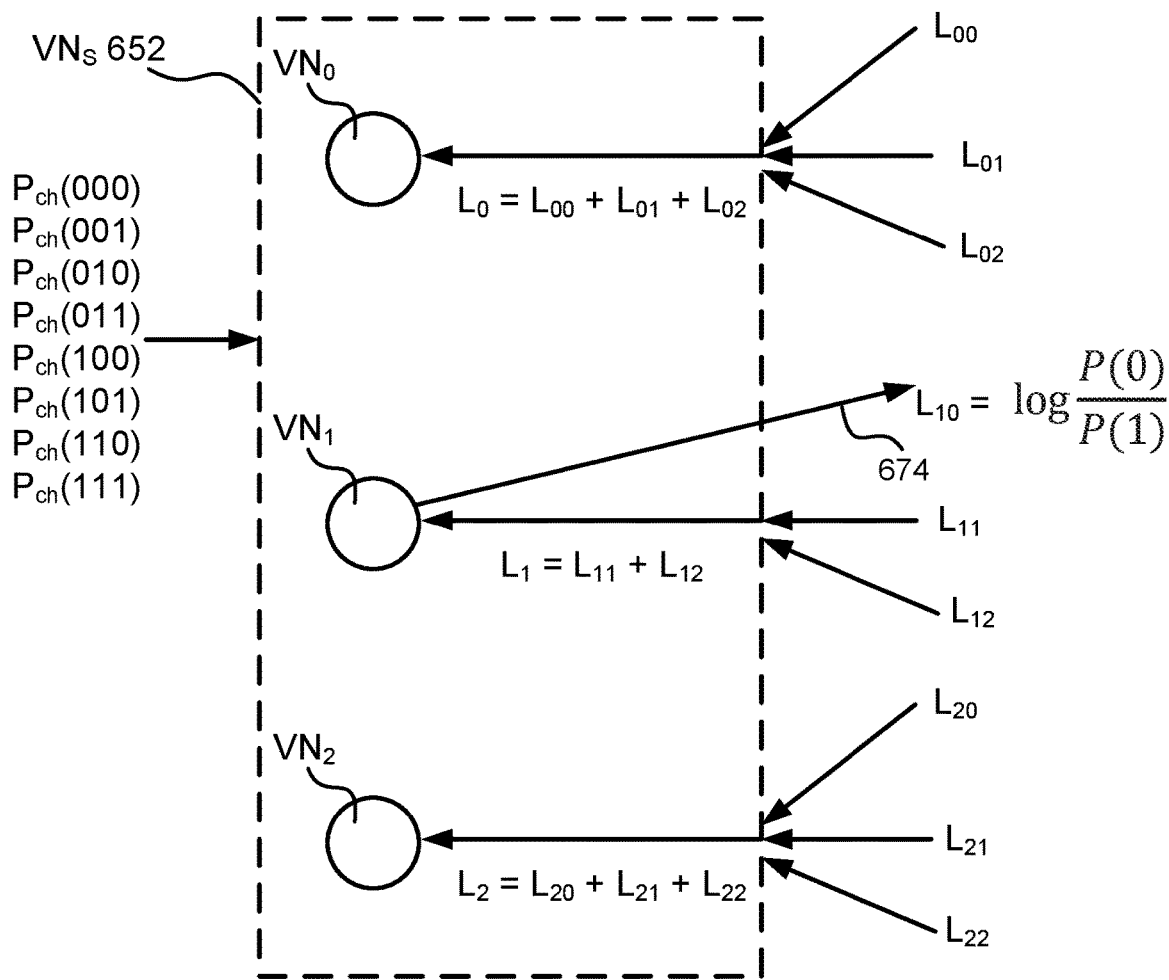

FIG. 6F depicts one embodiment of the multi-variable node $VN_S$ 652 that is associated with multiple variable nodes $VN_0$, $VN_1$, and $VN_2$. The multi-variable node $VN_S$ 652 takes as input the input channel probabilities Pch(000) through Pch(111) for the eight data states corresponding with three data bits. As depicted, the generated L-value $L_{10}$ 674 is equal to the log of P(0) 675 divided by P(1) 676. P(0) 675 is proportional to or equal to the sum of Pch(000)$e^{L0+L1+L2}$, Pch(001)$e^{L0+L1}$, Pch(100)$e^{L1+L2}$, and Pch(101)$e^{L1}$. P(1) 676 is proportional to or equal to the sum of Pch(010)$e^{L0+L2}$, Pch(011)$e^{L0}$, Pch(110)$e^{L2}$, and Pch(111). In this case, $L_0$ is equal to the sum of $L_{00}$, $L_{01}$, and $L_{02}$; $L_1$ is equal to the sum of $L_{11}$ and $L_{12}$; and $L_2$ is equal to the sum of $L_{20}$, $L_{21}$, and $L_{22}$. Thus, the output message for the generated L-value $L_{10}$ 674 takes into account all eight of the input channel probabilities Pch(000) through Pch(111).

Figure 6G:
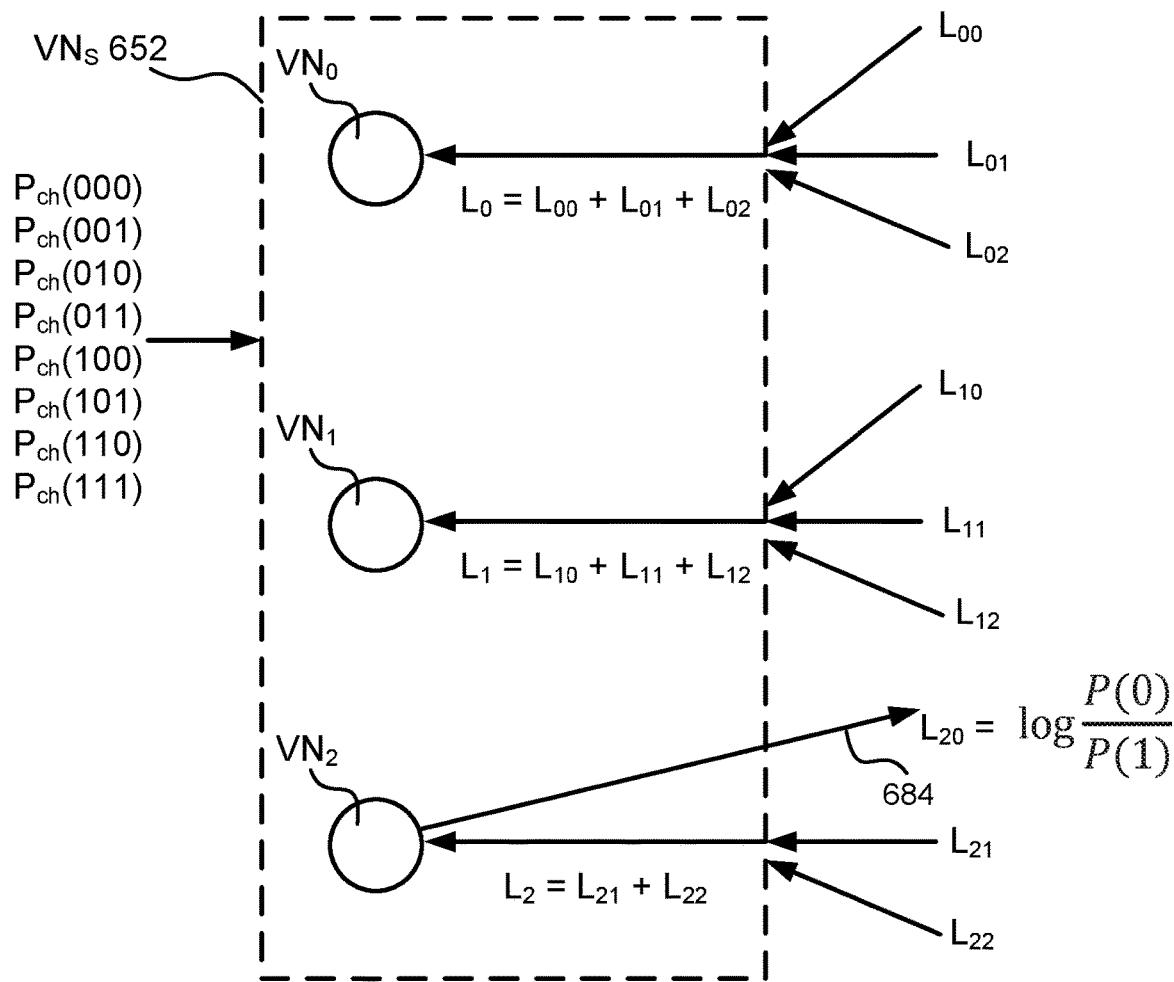

FIG. 6G depicts one embodiment of the multi-variable node $VN_S$ 652 that is associated with multiple variable nodes $VN_0$, $VN_1$, and $VN_2$. The multi-variable node $VN_S$ 652 takes as input the input channel probabilities Pch(000) through Pch(111) for the eight data states corresponding with three data bits. As depicted, the generated L-value $L_{20}$ 684 is equal to the log of P(0) 685 divided by P(1) 686. P(0) 685 is proportional to or equal to the sum of Pch(000)$e^{L0+L1+L2}$, Pch(010)$e^{L0+L2}$, Pch(100)$e^{L1+L2}$, and Pch(110)$e^{L2}$. P(1) 686 is proportional to or equal to the sum of Pch(001)$e^{L0+L1}$, Pch(011)$e^{L0}$, Pch(101)$e^{L1}$, and Pch(111). In this case, $L_0$ is equal to the sum of $L_{00}$, $L_{01}$, and $L_{02}$; $L_1$ is equal to the sum of $L_{10}$, $L_{11}$, and $L_{12}$; and $L_2$ is equal to the sum of $L_{21}$ and $L_{22}$. Thus, the output message for the generated L-value $L_{20}$ 684 takes into account all eight of the input channel probabilities Pch(000) through Pch(111).

Figure 7A:
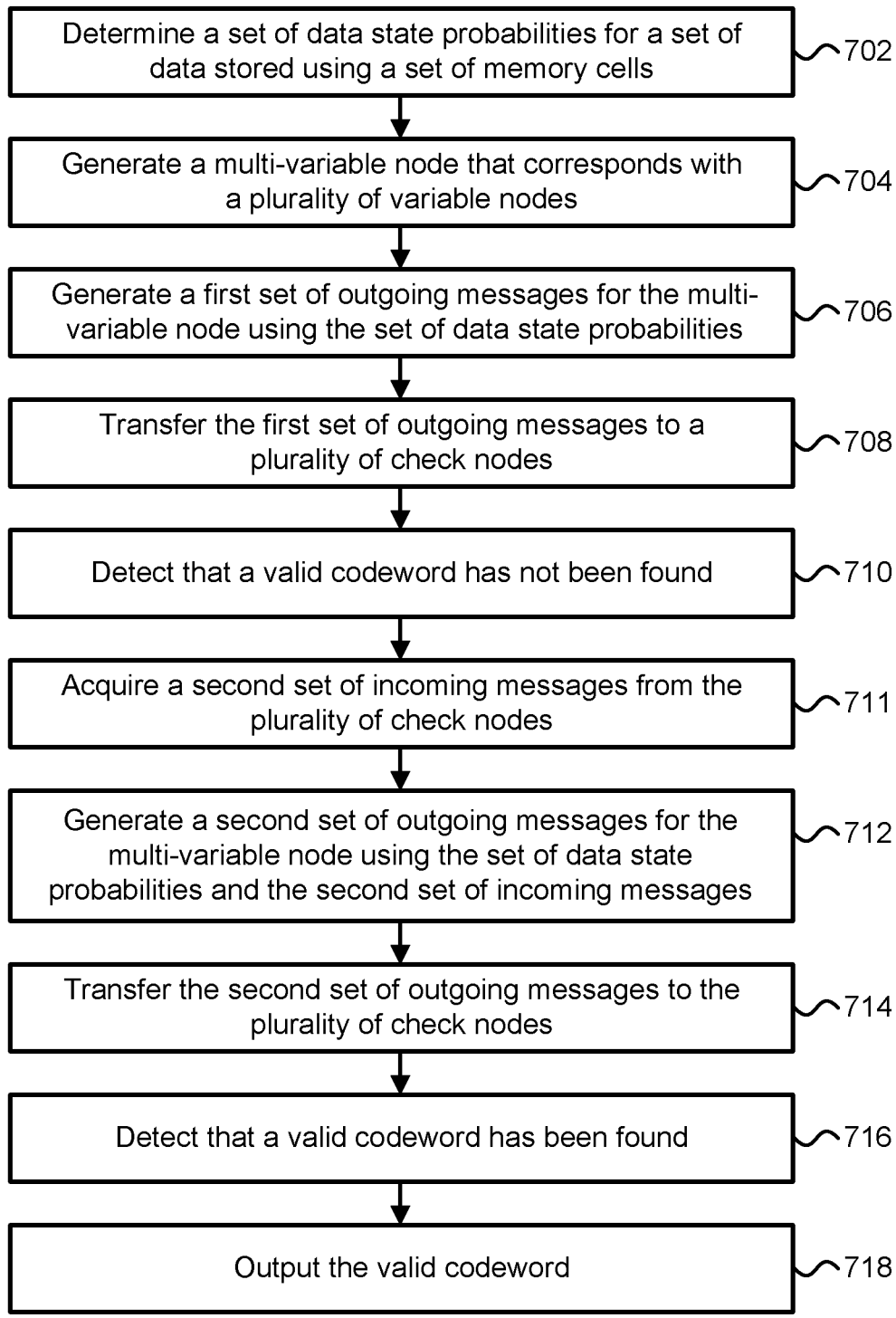
FIG. 7A is a flowchart describing one embodiment of a process for correcting data errors.

FIG. 7A is a flowchart describing one embodiment of a process for correcting data errors. In one embodiment, the process of FIG. 7A may be performed by a memory chip controller or a controller in communication with a plurality of memory banks, such as controller 102 in FIG. 1. The process of FIG. 7A may also be performed by LDPC decoding circuitry integrated with a semiconductor memory.

In step 702, a set of data state probabilities for a set of data stored using a set of memory cells is determined. The set of memory cells may be part of a semiconductor memory. The set of memory cells may comprise NAND Flash memory cells and the set of data state probabilities may be determined based on the sensed threshold voltages or the locations of the sensed threshold voltages within the threshold voltage windows. The sensed threshold voltages may be sensed using a sensing circuit or a read/write circuit, such as the read/write circuit 502 in FIG. 5B. In one example, if the threshold voltage window for the B-state is between 1.0V and 1.6V, then if the sensed threshold voltage is between 1.2V and 1.4V, then the data state probability may be set to 0.9 or 1.0; however, if the sensed threshold voltage is between 1.0V and 1.2V or between 1.4V and 1.6V, then the data state probability may be set to 0.45 or 0.5. Thus, the set of data state probabilities may depend on the sensed threshold voltages for the set of memory cells and/or the location of the sensed threshold voltages relative to the ends of their corresponding threshold voltage windows. In some cases, a threshold voltage window for a particular data state (e.g., the B-state) may include an edge region that is within a particular distance (e.g., within 50 mV) of an edge of the threshold voltage window. In some embodiments, a data state probability look-up table may be used to map the sensed threshold voltages to the set of data state probabilities. In one example, if a sensed threshold voltage is equal to 1.1V, then the outputted data state probability may comprise 0.45; however, if the sensed threshold voltage is equal to 1.3V, then the outputted data state probability may comprise 1.0.

In step 704, a multi-variable node that corresponds with a plurality of variable nodes within a Tanner graph is generated. In one example, the multi-variable node may correspond with the multi-variable node $VN_S$ 652 in FIGS. 6E-6G. In step 706, a first set of outgoing messages for the multi-variable node is generated using the set of data state probabilities determined in step 702. The first set of outgoing messages may include a first outgoing message corresponding with the generated L-value $L_{20}$ 684 in FIG. 6G, a second outgoing message corresponding with the generated L-value $L_{10}$ 674 in FIG. 6F, and a third outgoing message corresponding with the generated L-value $L_{00}$ 654 in FIG. 6E.

In step 708, the first set of outgoing messages is transferred to a plurality of check nodes. In step 710, it is detected that a valid codeword has not been found. In step 711, a second set of incoming messages is acquired from the plurality of check nodes. In step 712, a second set of outgoing messages for the multi-variable node is generated using the set of data state probabilities and the second set of incoming messages acquired in step 711. In step 714, the second set of outgoing messages is transferred to the plurality of check nodes. An iterative message passing algorithm may be used in which messages are passed through the edges of the Tanner graph between the plurality of check nodes and a plurality of multi-variable nodes including the multi-variable node until either a valid codeword is identified or an iteration limit is reached (e.g., more than twelve iterations have been performed). The message passing algorithm may comprise a sum-product decoding algorithm or a max-product decoding algorithm. The valid codeword may correspond with a valid set of data and parity bits that may be stored within a memory array of a semiconductor memory. In step 716, it is detected that a valid codeword has been found. In some cases, it may be detected that the valid codeword has been found if no bit errors are detected for the valid codeword. The valid codeword may be detected if each of the parity check equations associated with the plurality of check nodes for the Tanner graph are satisfied. In step 718, the valid codeword is outputted. In one example, the valid codeword may be stored using a semiconductor memory or transferred from the semiconductor memory to another integrated circuit.

Figure 7B:
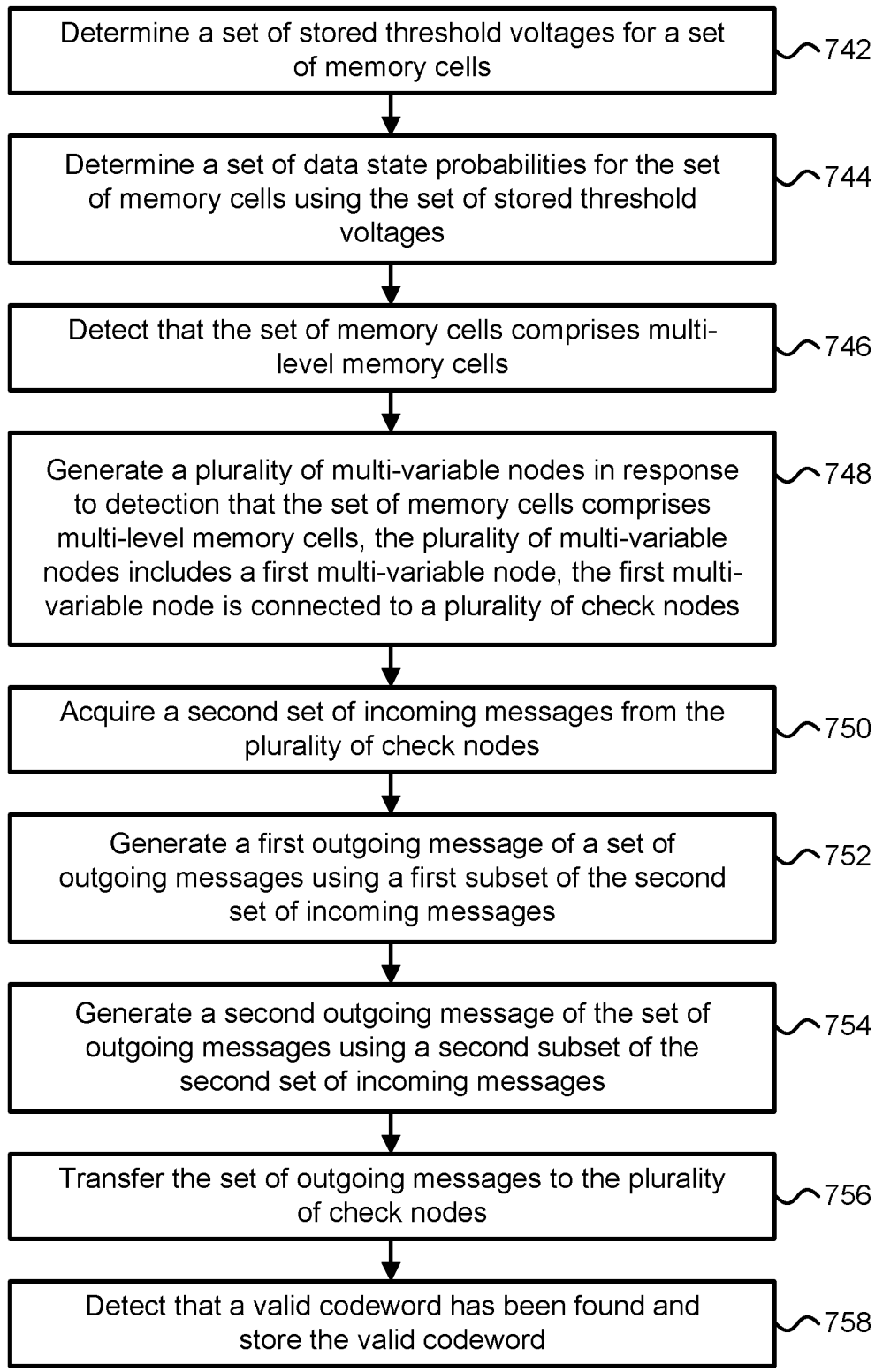
FIG. 7B is a flowchart describing another embodiment of a process for correcting data errors.

FIG. 7B is a flowchart describing another embodiment of a process for correcting data errors. In one embodiment, the process of FIG. 7B may be performed by a memory chip controller or a controller in communication with a plurality of memory banks, such as controller 102 in FIG. 1. The process of FIG. 7B may also be performed by LDPC decoding circuitry in communication with a semiconductor memory.

In step 742, a set of stored threshold voltages for a set of memory cells is determined. The set of memory cells may comprise NAND Flash memory cells. The set of stored threshold voltages may be determined using sensing circuitry or read/write circuitry, such as read/write circuitry 502 in FIG. 5B. In step 744, a set of data state probabilities for the set of memory cells is determined using the set of stored threshold voltages. In one example, the set of data state probabilities for the set of memory cells may be determined using a look-up table that maps sensed or stored threshold voltages to corresponding data states and probabilities for those data states. In some cases, the look-up table may map sensed or stored threshold voltages to data state probabilities for each of the possible data states for the set of memory cells (e.g., eight probabilities may be outputted for a three-bits-per-cell memory).

In some embodiments, a first memory cell of the set of memory cells may be sensed or read in order to determine whether the stored threshold voltage for the first memory cell is within one of a plurality of threshold voltage windows. The number of threshold voltage windows may be greater than the number of possible data states for the first memory cell. In some cases, a data state (e.g., the B-state) may be associated with three threshold voltage windows; the three windows may comprise a middle window with a high data state probability and two side windows with lower data state probabilities than the high data state probability. In one example, the middle window may cover a range of threshold voltages between 1.2V and 1.4V and correspond with a data state probability of 0.9; a first side window may cover threshold voltages between 1.0V and 1.2V and correspond with a data state probability of 0.45; and a second side window may cover threshold voltages between 1.4V and 1.6V and correspond with a data state probability of 0.45. In some embodiments, not every data state may be oversampled. For example, for a two-bits-per-cell memory cell, only the B and C data states may be oversampled.

In step 746, it is detected that the set of memory cells comprises multi-level memory cells. In step 748, a plurality of multi-variable nodes for a Tanner graph is generated in response to detection that the set of memory cells comprises multi-level memory cells. The plurality of multi-variable nodes includes a first multi-variable node. The first multi-variable node is connected to a plurality of check nodes of the Tanner graph. In one example, if it is detected that the set of memory cells comprise two-bits-per-cell memory cells, then the first multi-variable node may be formed by grouping two variable nodes. In another example, if it is detected that the set of memory cells comprise three-bits-per-cell memory cells, then the first multi-variable node may be formed by grouping three variable nodes.

In some embodiments, the Tanner graph may include a second multi-variable node corresponding with two variable nodes and a third multi-variable node corresponding with three variable nodes. In this case, the codeword may span both two-bits-per-cell and three-bits-per-cell memory cells at the same time. In other embodiments, the set of memory cells may store two-bits-per-cell at a first point in time and a first Tanner graph may include multi-variable nodes corresponding with two-bits-per-cell at the first point in time; then subsequently, the set of memory cells may store three-bits-per-cell at a second point in time and a second Tanner graph may include multi-variable nodes corresponding with three-bits-per-cell at the second point in time.

In step 750, a second set of incoming messages is acquired from the plurality of check nodes. The second set of incoming messages may correspond with $L_{01}$, $L_{02}$, $L_{20}$, $L_{21}$, $L_{22}$, $L_{11}$, and $L_{12}$ in FIG. 6E. In step 752, a first outgoing message of a set of outgoing messages is generated using a first subset of the second set of incoming messages. The first outgoing message may correspond with $L_{00}$ 654 in FIG. 6E. In step 754, a second outgoing message of the set of outgoing messages is generated using a second subset of the second set of incoming messages. The second outgoing message may correspond with $L_{10}$ 674 in FIG. 6F. The first subset of the second set of incoming messages may be different from the second subset of the second set of incoming messages. In step 756, the set of outgoing messages is transferred to the plurality of check nodes.

An iterative message passing algorithm may be used in which messages are passed through the edges of the Tanner graph between the plurality of check nodes and the plurality of multi-variable nodes including the first multi-variable node until either a valid codeword is identified or an iteration limit is reached. The message passing algorithm may comprise the modified sum-product decoding algorithm. The valid codeword may correspond with a valid set of data and parity bits that may be stored within a memory array of a semiconductor memory. In step 758, it is detected that a valid codeword has been found. In some cases, it may be detected that the valid codeword has been found if no bit errors are detected for the valid codeword or if each of the parity check equations associated with the plurality of check nodes for the Tanner graph are satisfied. The valid codeword may be stored using a semiconductor memory or transferred from the semiconductor memory to another integrated circuit.

One embodiment of the disclosed technology includes a semiconductor memory including a set of memory cells and one or more control circuits. The one or more control circuits configured to determine a set of sensed threshold voltages for the set of memory cells and determine a set of data state probabilities for the set of memory cells based on the set of sensed threshold voltages. The one or more control circuits configured to identify a multi-variable node that corresponds with a plurality of variable nodes of a bipartite graph. The bipartite graph includes the plurality of variable nodes and a plurality of check nodes. The one or more control circuits configured to generate a first set of outgoing messages for the multi-variable node using the set of data state probabilities and transfer the first set of outgoing messages to the plurality of check nodes. The one or more control circuits configured to detect that a valid codeword has been found based on a second set of incoming messages from the plurality of check nodes and store the valid codeword using the semiconductor memory in response to detection that the valid codeword has been found.

One embodiment of the disclosed technology includes determining a set of sensed threshold voltages for a set of memory cells of the semiconductor memory, determining a set of data state probabilities for the set of memory cells using the set of sensed threshold voltages, and identifying a multi-variable node that corresponds with a plurality of variable nodes of a bipartite graph. The bipartite graph includes the plurality of variable nodes and a plurality of check nodes. The method further comprises generating a first set of outgoing messages for the multi-variable node using the set of data state probabilities. The first set of outgoing messages comprises at least two different outgoing messages. The method further comprises transferring the first set of outgoing messages to the plurality of check nodes, detecting that a valid codeword has been found subsequent to transferring the first set of outgoing messages to the plurality of check nodes, and storing the valid codeword using the semiconductor memory in response to detecting that the valid codeword has been found.

One embodiment of the disclosed technology includes a set of memory cells and one or more control circuits. Each memory cell of the set of memory cells comprises a multi-level memory cell. The one or more control circuits configured to determine a set of stored threshold voltages for the set of memory cells and identify a set of data state probabilities for the set of stored threshold voltages. The one or more control circuits configured to generate a multi-variable node that corresponds with a plurality of variable nodes of a bipartite graph. The bipartite graph includes the plurality of variable nodes and a plurality of check nodes. The one or more control circuits configured to determine a number of data states per memory cell for the set of memory cells and generate the multi-variable node based on the number of data states per memory cell for the set of memory cells. The one or more control circuits configured to generate a first set of outgoing messages for the multi-variable node based on the set of data state probabilities and transfer the first set of outgoing messages to the plurality of check nodes. The one or more control circuits configured to detect that a valid codeword has been found based on a second set of incoming messages from the plurality of check nodes and store the valid codeword in response to detection that the valid codeword has been found.

In some cases, the one or more control circuits may be configured to generate a first message of the first set of outgoing messages using data state probabilities for each data state of the number of data states per memory cell for the set of memory cells. For example, if the number of data states per memory cell for the set of memory cells comprises three-bits-per-cell, then the first message may be generated using probabilities for each of the eight possible data states. The probabilities for each of the eight possible data states may correspond with the eight input channel probabilities Pch(000) through Pch(111) depicted in FIG. 6E.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   a semiconductor memory including a set of multi-level memory cells; and
   one or more control circuits configured to:
      determine a set of data state probabilities for the set of multi-level memory cells and
      generate a graph that includes a multi-variable node with edges to a plurality of check nodes, the set of data state probabilities comprises probabilities for each possible data state of the set of multi-level memory cells, generate a set of outgoing messages for the multi-variable node using the set of data state probabilities and transfer the set of outgoing messages for the multi-variable node to the plurality of check nodes, detect that a valid codeword has been found based on a set of incoming messages from the plurality of check nodes and store the valid codeword using the semiconductor memory in response to detection that the valid codeword has been found, the determination of the set of data state probabilities for the set of multi-level memory cells includes only oversampling a first subset of data states less than each possible data state of the set of multi-level memory cells, the first subset of data states and a second subset of data states less than each possible data state of the set of multi-level memory cells combined comprise each possible data state of the set of multi-level memory cells, each data state within the first subset of data states is different from any of the data states within the second subset of data states.

2. The apparatus of claim 1, wherein:
the set of multi-level memory cells comprises two-bits-per-cell memory cells and the determination of the set of data state probabilities for the set of multi-level memory cells includes oversampling only two data states out of the four possible data states for the two-bits-per-cell memory cells acid not oversampling the other two data states out of the four possible data states for the two-bits-per-cell memory cells.

3. The apparatus of claim 1, wherein:
the one or more control circuits configured to determine a number of data states stored per memory cell for the set of multi-level memory cells and generate the multi-variable node based on the number of data states stored per memory cell for the set of multi-level memory cells.

4. The apparatus of claim 3, wherein:
the one or more control circuits configured to generate a message of the set of outgoing messages using data state probabilities for each data state of the number of data states stored per memory cell for the set of multi-level memory cells.

5. The apparatus of claim 1, wherein:
the one or more control circuits configured to determine a set of sensed threshold voltages for the set of multi-level memory cells and determine the set of data state probabilities for the set of multi-level memory cells based on the set of sensed threshold voltages, the one or more control circuits configured to acquire a mapping table and determine the set of data state probabilities using the mapping table and the set of sensed threshold voltages.

6. The apparatus of claim 5, wherein:
the one or more control circuits configured to detect that a sensed threshold voltage of the set of sensed threshold voltages for a memory cell of the set of multi-level memory cells is within an edge region of a threshold voltage window and determine a subset of the set of data state probabilities based on detection that the sensed threshold voltage is within the edge region of the threshold voltage window.

7. The apparatus of claim 1, wherein:
the set of multi-level memory cells comprises NAND Flash memory cells.

8. The apparatus of claim 1, wherein:
the semiconductor memory comprises a non-volatile memory that is monolithically formed in out or more physical levels of memory cells having active areas disposed above a silicon substrate.

9. A method for operating a semiconductor memory, comprising:
determining a set of data state probabilities far a set of multi-level memory cells of the semiconductor memory;

generating a graph that includes a multi-variable node with edges to a plurality of check nodes, the set of data state probabilities comprises possibilities for each possible data state of the set of multi level memory cells, the determining the set of data state probabilities includes only oversampling a first subset of data states of the set of multi-level memory cells, the first subset of data states and a second subset of data states of the set of multi-level memory cells combined comprise each possible data state of the set of multi-level memory cells, each data state within the first subset of data states is different from any of the data states within the second subset of data states;

generating a set of outgoing messages for the multi-variable node using the set of data state probabilities, the set of outgoing messages comprises at least two different outgoing messages;

transferring the set of outgoing messages for the multi-variable node to the plurality of check nodes;

detecting that a valid codeword has been found subsequent to transferring the set of outgoing messages to the plurality of check nodes; and storing the valid codeword using the semiconductor memory in response to detecting that the valid codeword has been found.

10. The method of claim 9, further comprising:
determining a set of sensed threshold voltages for the set of multi-level memory cells of the semiconductor memory; and determining the set of data state probabilities for the set of multi-level memory cells using the set of sensed threshold voltages, the determining the set of data state probabilities for the set of multi-level memory cells includes acquiring a mapping table and determining the set of data state probabilities using the mapping table and the set of sensed threshold voltages.

11. The method of claim 10, wherein:
the determining the set of data state probabilities for the set of multi-level memory cells includes detecting that a sensed threshold voltage of the set of sensed threshold voltages for a memory cell of the set of multi-level memory cells is associated with one of a plurality of threshold voltage windows for a particular data state.

12. The method of claim 10, wherein:
the determining the set of data state probabilities for the set of multi-level memory cells includes detecting that a sensed threshold voltage of the set of sensed threshold voltages for a memory cell of the set of multi-level memory cells is within an edge region of a threshold voltage window.

13. The method of claim 9, wherein:
the set of data state probabilities for the set of multi-level memory cells includes a set of data state probabilities corresponding with each possible data state for a first memory cell of the set of multi-level memory cells.

14. The method of claim 9, further comprising:
determining the number of data states stored per memory cell for the set of multi-level memory cells and generating the multi-variable node based on the number of data states stored per memory cell for the set of multi-level memory cells.

15. The method of claim 14, wherein:
the generating the set of outgoing messages for the multi-variable node includes generating a message of the set of outgoing messages using data state probabilities for each data state of the number of data states stored per memory cell for the set of multi-level memory cells.

16. The method of claim 14, wherein:
the number of data states stored per memory cell for the set of multi-level memory cells comprises eight data states.

17. The method of claim 14, wherein:
the at least two different outgoing messages includes a first outgoing message generated using a plurality of input channel probabilities corresponding with each data state of the number of data states and a second outgoing message generated using the plurality of input channel probabilities.

18. The method of claim 9, wherein:
the set of multi-level memory cells comprises NAND Flash memory cells;
the first subset of data states of the set of multi-level memory cells comprises two data states; and
the second subset of data states of the set of multi-level memory cells comprises at least one data state.

19. A semiconductor memory, comprising:
a set of memory cells, each memory cell of the set of memory cells comprises a multi-level memory cell; and
one or more council circuits configured to:
   determine a set of stored threshold voltages for the set of memory cells and identify a set of data state probabilities for the set of stored threshold voltages,
   generate a graph that includes a multi-variable node with edges to a plurality of check nodes, the set of data state probabilities comprises probabilities for each possible data state of the set of memory cells, the identification of the set of data state probabilities includes oversampling a first subset of data states of the set of memory cells, the first subset of data states and a second subset of data states of the set of memory cells combined comprise each possible data state of the set of memory cells, each data state within the first subset of data states is different from any of the data states within the second subset of data states,
   determine a number of data states per memory cell for the set of memory cells and generate the multi-variable node based on the number of data states per memory cell for the set of memory cells,
   generate a set of outgoing messages for the multi-variable node based on the set of data state probabilities and
   transfer the set of outgoing messages for the multi-variable node to the plurality of check nodes,
   detect that a valid codeword has been found based on a set of incoming messages from the plurality of check nodes and
   store the valid codeword in response to detection that the valid codeword has been found.

20. The semiconductor memory of claim 19, wherein:
the one or more control circuits configured to generate a message of the set of outgoing messages using data state probabilities for each data state of the number of data states per memory cell for the set of memory cells, the first subset of data states includes the B and C data states.

* * * * *